(12) United States Patent
Tsuyuki et al.

(10) Patent No.: US 11,778,729 B2
(45) Date of Patent: Oct. 3, 2023

(54) ELECTRONIC CONTROL DEVICE

(71) Applicant: Hitachi Astemo, Ltd., Hitachinaka (JP)

(72) Inventors: Yasuhiro Tsuyuki, Tokyo (JP); Toshiaki Ishii, Tokyo (JP); Yoshio Kawai, Tokyo (JP)

(73) Assignee: Hitachi Astemo, Ltd., Ibaraki (JP)

( * ) Notice: Subject to any disclaimer, the term of this patent is extended or adjusted under 35 U.S.C. 154(b) by 114 days.

(21) Appl. No.: 17/619,186

(22) PCT Filed: Jun. 12, 2020

(86) PCT No.: PCT/JP2020/023149
§ 371 (c)(1),
(2) Date: Dec. 14, 2021

(87) PCT Pub. No.: WO2020/262032
PCT Pub. Date: Dec. 30, 2020

(65) Prior Publication Data
US 2022/0361314 A1    Nov. 10, 2022

(30) Foreign Application Priority Data

Jun. 25, 2019 (JP) ................................ 2019-117066

(51) Int. Cl.
*H05K 1/02* (2006.01)

(52) U.S. Cl.
CPC ........... *H05K 1/021* (2013.01); *H05K 1/0209* (2013.01)

(58) Field of Classification Search
CPC .... H05K 1/021; H05K 1/0209; H05K 1/0206; H05K 1/18; H05K 1/181; H05K 7/20463; H05K 7/10854; H05K 7/20409; H05K 7/20427; H05K 7/20481; H05K 7/20854; H05K 7/20445; H05K 5/0056;
(Continued)

(56) References Cited

U.S. PATENT DOCUMENTS

2006/0227515 A1* 10/2006 Enami ................... H01L 23/427
361/720
2011/0013365 A1    1/2011 Oota
(Continued)

FOREIGN PATENT DOCUMENTS

JP   H11-289036 A    10/1999
JP   2011-023593 A    2/2011
(Continued)

OTHER PUBLICATIONS

International Search Report, PCT/JP2020/023149, dated Oct. 20, 2020 (4 pgs.).

*Primary Examiner* — Amir A Jalali
(74) *Attorney, Agent, or Firm* — Volpe Koenig

(57) ABSTRACT

A temperature rise due to thermal interference between electronic components is suppressed. Electronic components (11a, 11b) are adjacently mounted on a circuit board (12). The circuit board (12) is fixed to a base (13). A rectangular convex portion (21) is provided on the base (13). The rectangular convex portion (21) is disposed so as to be located below the electronic components (11a, 11b) when the circuit board (12) is assembled to a housing (10). The rectangular convex portion (21) includes N concave portions (21a). The concave portions (21a) are arranged on a surface (21b) facing the region between the electronic components (11a, 11b).

9 Claims, 7 Drawing Sheets

(58) Field of Classification Search
CPC .. H05K 5/0017; H05K 5/0069; H05K 5/0073; H05K 5/069; H05K 5/065; H05K 5/0047; H05K 5/0204; H05K 5/0082; H05K 2201/10189; H01L 23/3675; H01L 23/3733; H01L 23/3677; H01L 23/3737; H01L 24/17; H01L 25/18
See application file for complete search history.

(56) References Cited

U.S. PATENT DOCUMENTS

| | | | |
|---|---|---|---|
| 2011/0228498 A1 | 9/2011 | Kawai et al. | |
| 2016/0073548 A1* | 3/2016 | Wei | H05K 7/203 |
| | | | 165/104.21 |
| 2016/0106010 A1* | 4/2016 | Ito | H05K 1/0209 |
| | | | 361/707 |
| 2017/0334375 A1* | 11/2017 | Shigyo | H01R 24/76 |
| 2018/0204784 A1* | 7/2018 | Kawase | H01L 25/072 |
| 2019/0109069 A1* | 4/2019 | Yamada | H01L 23/3677 |

FOREIGN PATENT DOCUMENTS

| | | |
|---|---|---|
| JP | 2011-192937 A | 9/2011 |
| JP | 2015-060865 A | 3/2015 |
| JP | 2017-011021 A | 1/2017 |

\* cited by examiner

FIG. 15

| | FIRST COMPARATIVE EXAMPLE | | FIRST COMPARATIVE EXAMPLE | | SECOND COMPARATIVE EXAMPLE | | THIRD COMPARATIVE EXAMPLE | |
|---|---|---|---|---|---|---|---|---|
| SINGLE CONCAVE PORTION | NOT INCLUDED | | NOT INCLUDED | | NOT INCLUDED | | INCLUDED | |
| PLURAL CONCAVE PORTIONS | NOT INCLUDED | | NOT INCLUDED | | NOT INCLUDED | | NOT INCLUDED | |
| COMPONENT TEMPERATURE (°C) | 3.5W ELECTRONIC COMPONENT | 1.0W ELECTRONIC COMPONENT | 3.5W ELECTRONIC COMPONENT | 1.0W ELECTRONIC COMPONENT | 3.5W ELECTRONIC COMPONENT | 1.0W ELECTRONIC COMPONENT | 3.5W ELECTRONIC COMPONENT | 1.0W ELECTRONIC COMPONENT |
| | 146.0 | | 126.0 | | 149.0 | 129.0 | 149.0 | 129.5 |
| TEMPERATURE RISE (°C) | — | | — | | 3.0 | 3.0 | 3.0 | 3.5 |

| | FIRST EMBODIMENT | | THIRD EMBODIMENT | | FOURTH EMBODIMENT | | FIFTH EMBODIMENT | |
|---|---|---|---|---|---|---|---|---|
| SINGLE CONCAVE PORTION | NOT INCLUDED | | NOT INCLUDED | | NOT INCLUDED | | NOT INCLUDED | |
| PLURAL CONCAVE PORTIONS | INCLUDED | | INCLUDED | | INCLUDED | | INCLUDED | |
| COMPONENT TEMPERATURE (°C) | 3.5W ELECTRONIC COMPONENT | 1.0W ELECTRONIC COMPONENT | 3.5W ELECTRONIC COMPONENT | 1.0W ELECTRONIC COMPONENT | 3.5W ELECTRONIC COMPONENT | 1.0W ELECTRONIC COMPONENT | 3.5W ELECTRONIC COMPONENT | 1.0W ELECTRONIC COMPONENT |
| | 147.5 | 128.5 | 147.0 | 128.0 | 148.0 | 128.5 | 148.0 | 128.5 |
| TEMPERATURE RISE (°C) | 1.5 | 2.5 | 1.0 | 2.0 | 2.0 | 2.5 | 2.0 | 2.5 | ns # ELECTRONIC CONTROL DEVICE

TECHNICAL FIELD

The present invention relates to an electronic control device that can be mounted on a vehicle.

BACKGROUND ART

Due to the high functionality of an in-vehicle electronic control device, the amount of heat generated by electronic components increases. In addition, in an automatic driving system or the like, it is necessary to arrange electronic components close to each other due to the necessity of high-speed transmission between electronic components. In general, a heat-generating electronic component is thermally connected to a heat dissipation block provided in a housing or the like via a heat dissipation member to dissipate heat. When a plurality of heat-generating electronic components are arranged close to each other, the temperature of each heat-generating electronic component increases due to thermal interference between the plurality of heat-generating electronic components arranged in the heat dissipation block that dissipates the heat of the heat-generating electronic components. In order to suppress thermal interference between heat-generating electronic components, PTL 1 proposes a structure configured to suppress thermal interference by forming a single concave portion in a heat dissipation block.

CITATION LIST

Patent Literature

PTL 1: JP 11-289036 A

SUMMARY OF INVENTION

Technical Problem

Currently, in an in-vehicle electronic control device, a change from a metal housing to a housing using a resin composite has been studied for weight reduction. A housing using a resin composite has lower thermal conductivity than a metal housing. Accordingly, in the structure disclosed in PTL 1, heat is retained in the heat dissipation block immediately below heat generating components, and sufficient heat dissipation cannot be obtained.

The present invention has been made in view of the above circumstances and has as its object to provide an electronic control device that can suppress a temperature rise due to thermal interference between electronic components.

Solution to Problem

In order to achieve the above object, an electronic control device according to the first aspect includes a circuit board on which a first electronic component and a second electronic component are mounted adjacent to each other and a housing that fixes the circuit board. The circuit board includes N (N is an integer of 2 or more) through holes or concave portions arranged between a mounting region of the first electronic component and a mounting region of the second electronic component.

Advantageous Effects of Invention

According to the present invention, it is possible to suppress a temperature rise due to thermal interference between electronic components.

BRIEF DESCRIPTION OF DRAWINGS

FIG. 15 is a diagram illustrating the comparisons of numerical examples of temperature rises among the first, third, fourth, and fifth embodiments and the first, second, and third comparative examples.

DESCRIPTION OF EMBODIMENTS

Embodiments will be described with reference to the accompanying drawings. Note that the embodiments described below do not limit the invention according to the claims, and all of various elements and combinations thereof described in the embodiments are not necessarily essential to the solution of the invention.

Figure 1:
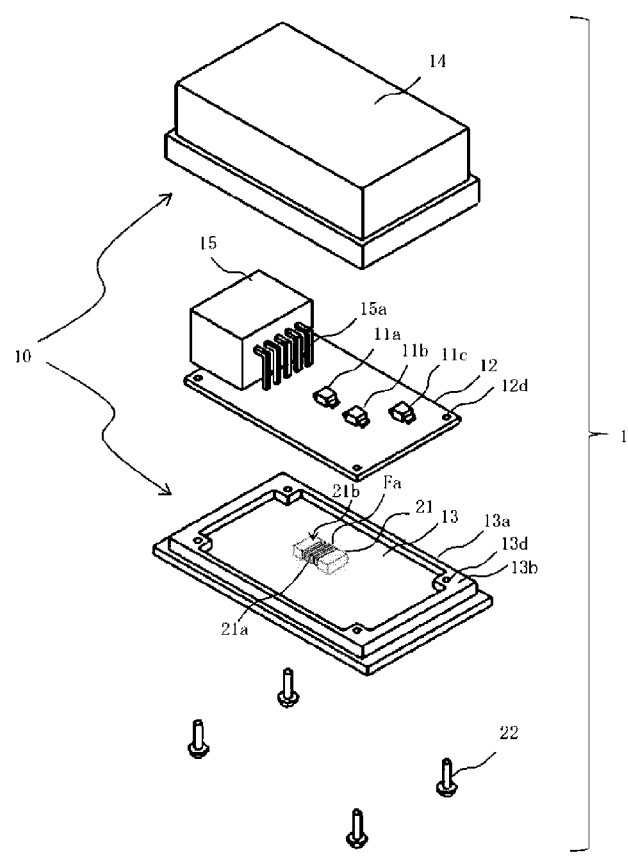
FIG. 1 is an exploded perspective view illustrating the configuration of an electronic control device according to the first embodiment.

FIG. 1 is an exploded perspective view illustrating the configuration of an electronic control device according to the first embodiment.

Referring to FIG. 1, an in-vehicle electronic control device 1 includes a circuit board 12 and a housing 10. The housing 10 includes a base 13 and a cover 14.

Electronic components 11a to 11c are mounted on the circuit board 12. The electronic components 11a to 11c are, for example, heat-generating electronic components such as semiconductor elements. The electronic components 11a to 11c can be mounted on the circuit board 12, for example, in a package state in which a semiconductor chip is sealed. This package is, for example, a small outline package (SOP), a quad flat package (QFP), or a ball grid array (BGA).

In this case, the electronic components 11a and 11b are adjacently mounted on the circuit board 12. The electronic component 11a is, for example, a microcomputer, and the electronic component 11b is, for example, an application specific integrated circuit (ASIC).

On the circuit board 12, in addition to the electronic components 11a to 11c, passive components such as resistors and capacitors forming an electronic circuit are electrically connected to one surface or both surfaces of the circuit board 12 using a conductive connection material such as solder.

A connector 15 is mounted on the circuit board 12. The connector 15 electrically connects the circuit board 12 and the outside. The connector 15 can be disposed at an end portion of the circuit board 12. A required number of pin terminals 15a are inserted into and attached to the main body of the connector 15 by press fitting or the like. The connector 15 is electrically joined to the circuit board 12 by soldering or press-fitting the pin terminals 15a to the circuit board 12.

The circuit board 12 further includes screw holes 12d. A screw 22 as an example of a fastening member can be inserted into the screw hole 12d. The screw holes 12d can be arranged at four corners of the circuit board 12.

As the circuit board 12, for example, a laminated wiring board made of a thermosetting resin, a glass cloth, and a metal wiring on which a circuit pattern is formed, a substrate made of ceramics and metal wiring, or a flexible substrate such as polyimide.

The housing 10 fixes the circuit board 12. At this time, the circuit board 12 is fixed to the base 13. The base 13 includes a frame member 13a that supports the circuit board 12 on the base 13. Pedestal portions 13b are provided at four corners of the frame member 13a. The entire base 13 has a substantially rectangular flat plate shape so as to close the lower surface opening of the cover 14. The base 13 and the pedestal portion 13b are provided with screw holes 13d.

A rectangular convex portion 21 is provided on the base 13. The rectangular convex portion 21 is disposed so as to be located below the electronic components 11a and 11b when the circuit board 12 is assembled to the housing 10. The rectangular convex portion 21 is in contact with or close to the circuit board 12 when the circuit board 12 is assembled to the housing 10, and can improve the heat dissipation performance of the electronic components 11a and 11b. At this time, the frame member 13a supports the circuit board 12 on the base 13 such that the circuit board 12 comes into contact with or approaches the rectangular convex portion 21.

The rectangular convex portion 21 includes N (N is an integer of 2 or more) concave portions 21a. The concave portions 21a can be arranged in a surface 21b facing the region between the electronic components 11a and 11b. The concave portion 21a can be formed in, for example, a slit shape. In this case, in the rectangular convex portion 21, fins Fa standing on the base 13 are formed between the concave portions 21a.

The cover 14 protects the circuit board 12 from impact, dust, and the like. The cover 14 has a box shape or a lid shape such that a lower surface assembled to the base 13 is opened so as to cover the circuit board 12.

The base 13 and the cover 14 are assembled by sandwiching the circuit board 12 to which the connector 15 is attached, thereby constituting a box-type in-vehicle electronic control device. For example, the circuit board 12 is fixed to the housing 10 while being sandwiched between the pedestal portion 13d and the cover 14 by screwing the screws 22 into the cover 14 while being inserted into the screw holes 13d and 12d.

The structure in which the cover 14 and the base 13 are combined and fixed is not limited to the structure in which the cover 14 and the base 13 are screwed and fixed with the screws 22. For example, an assembly hole provided in an upright portion rising from the base 13 may be fitted and fixed or bonded and fixed to a protrusion provided on the cover 14.

The base 13 and the cover 14 are manufactured by casting, pressing, cutting, injection molding, or the like using a metal material or a resin composite material. For the base 13 and the cover 14, a metal material obtained by casting or rolling an alloy mainly composed of aluminum, magnesium, iron, and the like may be used, or a composite material composed of a resin and a filler may be used.

This composite material is obtained by, for example, injection molding, compression molding, or transfer molding of a mixture obtained by mixing at least one or more resins selected from a thermoplastic resin such as polybutylene terephthalate, polyamide, polyethylene terephthalate, or polyphenylene sulfide, and a thermosetting resin such as an epoxy resin, a phenol resin, a polyimide resin, or an unsaturated polyester resin, and at least one or more kinds of an inorganic filler such as glass fiber, silica, or alumina, or metal powder. The base 13 and the cover 14 may be made of the same material or different materials.

In this case, using a composite material made of a resin and a filler for the base 13 and the cover 14 can reduce the weight of the in-vehicle electronic control device 1.

In addition, providing the N concave portions 21a in the rectangular convex portion 21 can block an interference path of heat transferred in the horizontal direction in the rectangular convex portion 21 between the electronic components 11a and 11b while securing a heat dissipation path of heat transferred in the vertical direction in the rectangular convex portion 21. Therefore, it is possible to reduce thermal interference between the electronic components 11a and 11b while suppressing deterioration in the heat dissipation performance of the electronic components 11a and 11b, and it is possible to suppress the temperature rises of the electronic components 11a and 11b.

Figure 2:
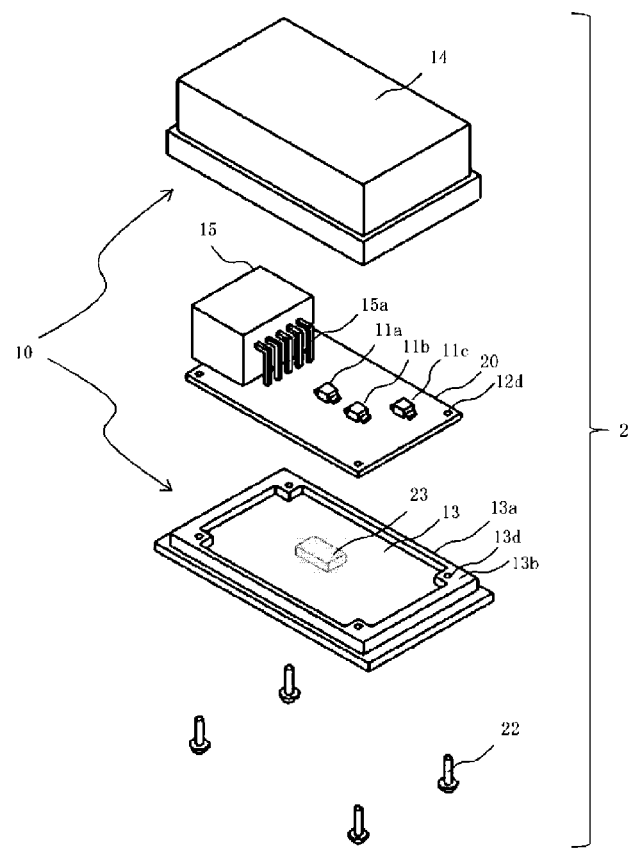
FIG. 2 is an exploded perspective view illustrating the configuration of the electronic control device when a concave portion 21a in FIG. 1 is not provided.

FIG. 2 is an exploded perspective view illustrating the configuration of the electronic control device when the concave portions 21a in FIG. 1 are not provided.

Referring to FIG. 2, the in-vehicle electronic control device 2 includes a rectangular convex portion 23 instead of the rectangular convex portion 21 in FIG. 1. The concave portions 21a in FIG. 1 are removed from the rectangular convex portion 23. Other configurations of an in-vehicle electronic control device 2 are similar to those of the in-vehicle electronic control device 1 of FIG. 1.

In the case of using the rectangular convex portion 23, since there is no concave portion 21a in FIG. 1, heat is easily transferred in the horizontal direction through the rectangular convex portion 23 between the electronic components 11a and 11b as compared with the case of using the rectangular convex portion 21.

Accordingly, in the case of using the rectangular convex portion 23, the thermal interference between the electronic components 11a and 11b increases, and the temperature rises of the electronic components 11a and 11b increases, as compared with the case of using the rectangular convex portion 21.

Figure 3:
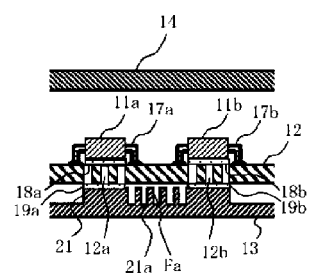
FIG. 3 is a cross-sectional view illustrating the configuration of the electronic control device of FIG. 1 cut at the positions of electronic components 11a and 11b.

FIG. 3 is a cross-sectional view illustrating the configuration of the electronic control device of FIG. 1 cut at the positions of the electronic components 11a and 11b.

Referring to FIG. 3, the circuit board 12 includes thermal vias 12a and 12b in addition to the configuration in FIG. 1. The thermal vias 12a and 12b dissipate heat generated by the electronic components 11a and 11b in the vertical direction through the circuit board 12. A filler for improving the heat dissipation performance may be embedded in the thermal vias 12a and 12b. The thermal vias 12a and 12b are arranged so as to be located directly below the electronic components 11a and 11b. Further, the thermal vias 12a and 12b are arranged so as to be located directly above the rectangular convex portion 21 when the circuit board 12 is assembled to the housing 10.

The electronic components 11a and 11b include terminals 17a and 17b. The electronic components 11a and 11b are electrically joined to the circuit board 12 by soldering the terminals 17a and 17b to the circuit board 12.

Heat dissipation members 18a and 18b are provided between the electronic components 11a and 11b and the circuit board 12. Heat dissipation members 19a and 19b are provided between the rectangular convex portion 21 and the circuit board 12 so as to respectively correspond to the electronic components 11a and 11b.

The heat dissipation members 18a, 18b, 19a, and 19b dissipate heat generated by the electronic components 11a and 11b to the rectangular convex portion 21 by thermal contact. In addition, the heat dissipation members 18a and 18b alleviate stress applied to the circuit board 12 due to a difference in thermal expansion coefficient between each of the electronic components 11a and 11b and the circuit board 12.

The heat dissipation member 20 is preferably made of an adhesive, grease, a sheet-like material containing a highly thermally conductive filler in a thermoplastic resin, or a sheet-like material containing a highly thermally conductive filler in a thermosetting resin such as silicone resin or epoxy resin. The highly thermally conductive filler is, for example, a metal, alumina, carbon, or the like.

Figure 4:
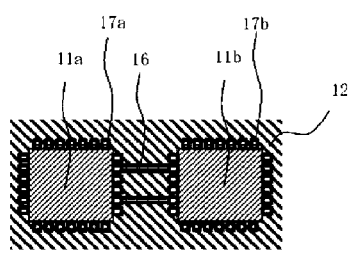
FIG. 4 is a plan view illustrating the configuration of a circuit board on which the electronic components 11a and 11b in FIG. 3 are mounted.

FIG. 4 is a plan view illustrating the configuration of the circuit board on which the electronic components 11a and 11b in FIG. 3 are mounted.

Referring to FIG. 4, the circuit board 12 includes wiring 16. The wiring 16 can linearly connect the terminals 17a and 17b and connect the terminals 17a and 17b via the shortest path.

Figure 5:
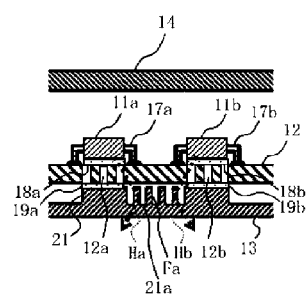
FIG. 5 is a cross-sectional view illustrating the propagation direction of heat in a thermal interference path between the electronic components 11a and 11b in FIG. 3.

FIG. 5 is a cross-sectional view illustrating the propagation direction of heat in a thermal interference path between the electronic components 11a and 11b in FIG. 3.

Referring to FIG. 5, heats Ha and Hb transferred in the horizontal direction through the rectangular convex portion 21 between the electronic components 11a and 11b are blocked by the concave portions 21a. The heats Ha and Hb respectively generated in the electronic components 11a and 11b are dissipated to the base 13 via the fins Fa in the concave portions 21a.

This can reduce thermal interference between the electronic components 11a and 11b while dissipating the heats Ha and Hb generated by the electronic components 11a and 11b in the vertical direction via the rectangular convex portion 21, and hence can suppress the temperature rises of the electronic components 11a and 11b.

In this case, in order to suppress the temperature rises of the electronic components 11a and 11b as much as possible, it is preferable to set the number and arrangement positions of the concave portions 21a such that the heat interference at the rectangular convex portion 21 between the electronic components 11a and 11b is cut off and a heat dissipation path for dissipating heat to the base 13 via the rectangular convex portion 21 is secured to the maximum extent.

Figure 6:
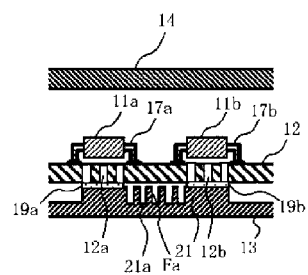
FIG. 6 is a cross-sectional view illustrating a peripheral configuration of electronic components 11a and 11b applied to an electronic control device according to the second embodiment.

FIG. 6 is a cross-sectional view illustrating a peripheral configuration of electronic components 11a and 11b applied to an electronic control device according to the second embodiment.

In the configuration in FIG. 6, the heat dissipation members 18a and 18b in FIG. 3 are removed, and a gap is provided between each of the electronic components 11a and 11b and the circuit board 12. This makes it possible to prevent the electronic components 11a and 11b from coming into contact with the circuit board 12 and to alleviate the stress applied to the electronic components 11a and 11b.

Figure 7:
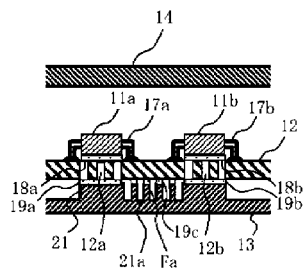
FIG. 7 is a cross-sectional view illustrating a peripheral configuration of electronic components 11a and 11b applied to an electronic control device according to the third embodiment.

FIG. 7 is a cross-sectional view illustrating a peripheral configuration of electronic components 11a and 11b applied to an electronic control device according to the third embodiment.

In the configuration in FIG. 7, a heat dissipation member 19c is added to the configuration in FIG. 3. The heat dissipation member 19c is provided between fins Fa and circuit board 12. The heat dissipation member 19c dissipates heat generated by the electronic components 11a and 11b to the rectangular convex portion 21 by thermal contact. As a result, the heat dissipation performance of the heat generated by the electronic components 11a and 11b can be improved, and the temperature rises of the electronic components 11a and 11b can be suppressed as compared with the configuration in FIG. 3.

Figure 8:
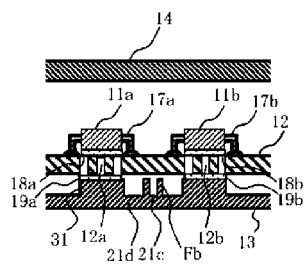
FIG. 8 is a cross-sectional view illustrating a peripheral configuration of electronic components 11a and 11b applied to an electronic control device according to the fourth embodiment.

FIG. 8 is a cross-sectional view illustrating a peripheral configuration of electronic components 11a and 11b applied to an electronic control device according to the fourth embodiment.

In the configuration of FIG. 8, a rectangular convex portion 31 is provided instead of the rectangular convex portion 21 in FIG. 3. The rectangular convex portion 31 includes concave portions 21c and 21d. In this case, in the rectangular convex portion 31, fins Fb standing on the base 13 are formed between the concave portions 21c and 21d.

In this case, the numbers and the bottom areas of the concave portions 21c and 21d can be different from each other. At this time, the number and arrangement positions of the fins Fb in FIG. 8 can be made different from the number and arrangement positions of the fins Fa in FIG. 3.

In this case, making the numbers and the bottom areas of the concave portions 21c and 21d different from each other can optimize the number and the arrangement positions of the fins Fb and improve the heat dissipation performance while suppressing thermal interference between the electronic components 11a and 11b.

Figure 9:
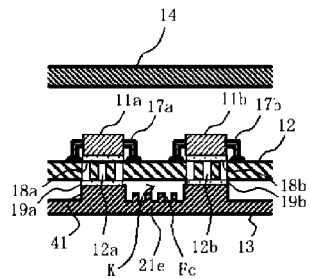
FIG. 9 is a cross-sectional view illustrating a peripheral configuration of electronic components 11a and 11b applied to an electronic control device according to the fifth embodiment.

FIG. 9 is a cross-sectional view illustrating a peripheral configuration of electronic components 11a and 11b applied to an electronic control device according to the fifth embodiment.

In the configuration of FIG. 9, a rectangular convex portion 41 is provided instead of the rectangular convex portion 21 in FIG. 3. The rectangular convex portion 41 includes concave portions 21e. In this case, in the rectangular convex portion 41, fins Fc standing on a base 13 are formed between the concave portions 21e.

In this case, the height of the fin Fc is set to be lower than the height of the rectangular convex portion 41. At this time, a gap K wider than the width of the concave portion 21e is formed on the fin Fc. Accordingly, heat generated by the electronic components 11a and 11b can be less likely to be transferred in the lateral direction through the rectangular convex portion 41, and thermal interference between the electronic components 11a and 11b can be suppressed.

Figure 10:
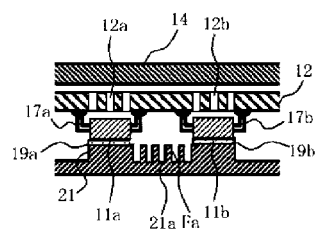
FIG. 10 is a cross-sectional view illustrating a peripheral configuration of electronic components 11a and 11b applied to an electronic control device according to the sixth embodiment.

FIG. 10 is a cross-sectional view illustrating a peripheral configuration of electronic components 11a and 11b applied to an electronic control device according to the sixth embodiment.

In each of the configurations in FIGS. 1 to 9, the circuit board 12 is disposed between the electronic components 11a and 11b and the rectangular convex portion, but in the configuration in FIG. 10, the electronic components 11a and 11b are arranged between the circuit board 12 and the rectangular convex portion 21.

At this time, the electronic components 11a and 11b can be brought into contact with the rectangular convex portion 21 via heat dissipation members 19a and 19b, and heat generated by the electronic components 11a and 11b can be released to the rectangular convex portion 21 without passing through the circuit board 12. In addition, heat transferred in the horizontal direction to the rectangular convex portion 21 between the electronic components 11a and 11b can be blocked by the concave portions 21a, and thermal interference between the electronic components 11a and 11b can be reduced.

Figure 11:
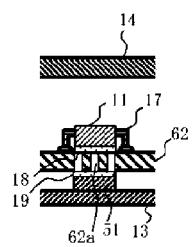
FIG. 11 is a cross-sectional view illustrating a peripheral configuration of an electronic components 11 applied to an electronic control device according to the first comparative example.

FIG. 11 is a cross-sectional view illustrating a peripheral configuration of an electronic components 11 applied to an electronic control device according to the first comparative example.

Referring to FIG. 11, instead of the electronic components 11a and 11b in FIG. 3, the electronic component 11 is mounted alone on a circuit board 62. The circuit board 62 includes a thermal via 62a instead of the thermal vias 12a and 12b in FIG. 3.

In the configuration of FIG. 11, a rectangular convex portion 51 is provided instead of the rectangular convex portion 21 in FIG. 3. The concave portion 21a in FIG. 3 is removed from the rectangular convex portion 51.

The electronic component 11 includes a terminal 17. A heat dissipation member 18 is provided between the electronic component 11 and the circuit board 62, and a heat dissipation member 19 is provided between the rectangular convex portion 51 and the circuit board 62.

When the electronic component 11 is mounted alone on the circuit board 62, thermal interference does not occur between the electronic components, and there is no temperature rise of the electronic component 11 due to the thermal interference.

Figure 12:
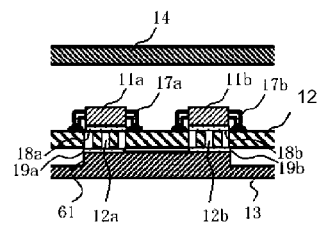
FIG. 12 is a cross-sectional view illustrating a peripheral configuration of electronic components 11a and 11b applied to an electronic control device according to the second comparative example.

FIG. 12 is a cross-sectional view illustrating a peripheral configuration of electronic components 11a and 11b applied to an electronic control device according to the second comparative example.

In the configuration of FIG. 12, a rectangular convex portion 61 is provided instead of the rectangular convex portion 21 in FIG. 3. The concave portion 21a in FIG. 3 is removed from the rectangular convex portion 61. Other configurations of the in-vehicle electronic control device in FIG. 12 are similar to those in FIG. 3.

Figure 13:
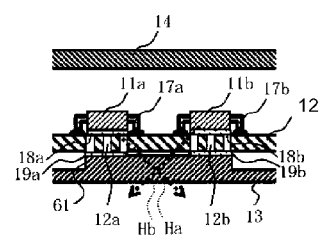
FIG. 13 is a cross-sectional view illustrating the propagation direction of heat in a thermal interference path between the electronic components 11a and 11b in FIG. 12.

FIG. 13 is a cross-sectional view illustrating the propagation direction of heat in a thermal interference path between the electronic components 11a and 11b in FIG. 12.

Referring to FIG. 13, since the rectangular convex portion 61 does not have the concave portions 21a, heats Ha and Hb respectively generated by the electronic components 11a and 11b are transferred in the horizontal direction through the rectangular convex portion 61. This causes thermal interference between the electronic components 11a and 11b, resulting in the temperature rises of the electronic components 11a and 11b due to the thermal interference.

Figure 14:
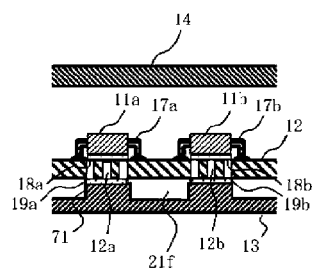
FIG. 14 is a cross-sectional view illustrating a peripheral configuration of electronic components 11a and 11b applied to an electronic control device according to the third comparative example.

FIG. 14 is a cross-sectional view illustrating a peripheral configuration of electronic components 11a and 11b applied to an electronic control device according to the third comparative example.

In the configuration of FIG. 14, a rectangular convex portion 71 is provided instead of the rectangular convex portion 21 in FIG. 3. The rectangular convex portion 71 includes a single concave portion 21f instead of the N concave portions 21a in FIG. 3. The concave portion 21f is formed over the entire arrangement region of the N concave portions 21a in FIG. 3. Other configurations of the in-vehicle electronic control device in FIG. 14 are similar to those in FIG. 3. Providing the concave portion 21f in the rectangular convex portion 71 can suppress thermal interference between the electronic components 11a and 11b.

FIG. 15 is a diagram illustrating the comparisons of numerical examples of temperature rises among the first, third, fourth, and fifth embodiments and the first, second, and third comparative examples.

FIG. 15 illustrates, in the first comparative example, the component temperature in the case of using a 3.5 W electronic component as the electronic component 11 in FIG. 11 and the component temperature in the case of using a 1.0 W electronic component as the electronic component 11. FIG. 15 illustrates, in the first, third, fourth, and fifth embodiments and the second and third comparative examples, the component temperatures in the case of using a 3.5 W electronic component and a 1.0 W electronic component as the electronic components 11a and 11b in FIGS. 3, 7, 8, 9, 12, and 14.

In the second comparative example, as illustrated in FIG. 13, thermal interference occurs between the electronic components 11a and 11b, resulting in a temperature rise of 3° C. as compared with the first comparative example. In the third comparative example, since the rectangular convex portion 71 has the concave portion 21f, thermal interference between the electronic components 11a and 11b can be suppressed, but a heat radiation path for releasing heat from the rectangular convex portion 71 to the base 13 is reduced. Accordingly, as compared with the second comparative example, the temperature rise does not change in the 3.5 W electronic component, but a temperature rise of 0.5° C. is caused in the 1.0 W electronic component.

In the first embodiment, since the N concave portions 21a are in the rectangular convex portion 21, the temperature rise is suppressed to 1.5° C. for the 3.5 W electronic component and 2.5° C. for the 1.0 W electronic component as compared with the first comparative example.

In the second embodiment, since the heat dissipation member 19c is added to the configuration of the first embodiment, the temperature rise is suppressed to 1.0° C. for the 3.5 W electronic component and 2.0° C. for the 1.0 W electronic component as compared with the first comparative example.

In the third embodiment, since the concave portions 21c and 21d are in the rectangular convex portion 31, the temperature rise is suppressed to 2.0° C. for the 3.5 W electronic component and 2.5° C. for the 1.0 W electronic component as compared with the first comparative example. However, in the configuration in FIG. 8, a heat radiation path for releasing heat from the rectangular convex portion 31 to the base 13 is reduced as compared with the configuration in FIG. 3. Accordingly, as compared with the first embodiment, the temperature rise does not change in the 1.0 W electronic component, but a temperature rise of 0.5° C. is caused in the 3.5 W electronic component.

In the fourth embodiment, since the concave portions 21e are in the rectangular convex portion 41, the temperature rise is suppressed to 2.0° C. for the 3.5 W electronic component and 2.5° C. for the 1.0 W electronic component as compared with the first comparative example. However, in the configuration in FIG. 9, a heat radiation path for releasing heat from the rectangular convex portion 41 to the base 13 is reduced as compared with the configuration in FIG. 3. Accordingly, as compared with the first embodiment, the temperature rise does not change in the 1.0 W electronic component, but a temperature rise of 0.5° C. is caused in the 3.5 W electronic component.

In addition, the present invention is not limited to above-described embodiments and includes various modifications. For example, the above-described embodiment has been described in detail for easy understanding of the present invention, and is not necessarily limited to one having all the configurations described above. Further, part of the configuration of one embodiment can be replaced with the configuration of another embodiment, and the configuration of another embodiment can be added to the configuration of one embodiment. Moreover, it is possible to add, delete, and replace other configurations with respect to part of the configurations of each embodiments.

REFERENCE SIGNS LIST 1 in-vehicle electronic control device
11a to 11c electronic component
12 circuit board
13 base
14 cover
15 connector
15a pin terminal
16 wiling
17a, 17b terminal
12a, 12b thermal via
18a, 18b, 19a, 19b heat dissipation member
21 rectangular convex portion
21a slit
22 screw

The invention claimed is:

1. An electronic control device comprising:
a circuit board on which a first electronic component and a second electronic component are mounted adjacent to each other; and
a housing that fixes the circuit board,
wherein the housing includes N (N is an integer not less than 2) concave portions arranged on a surface facing a region between the first electronic component and the second electronic component,
wherein the housing includes a base that fixes the circuit board, and a convex portion disposed below the first electronic component and the second electronic component and protruding above the base, and the concave portion is formed in the convex portion.

2. The electronic control device according to claim 1, wherein the housing is made of a composite material including a resin and a filler.

3. The electronic control device according to claim 1, wherein the convex portion includes a fin formed between the concave portions.

4. The electronic control device according to claim 1, further comprising:
a first heat dissipation member provided between the first electronic component and the circuit board or between the first electronic component and the housing; and
a second heat dissipation member provided between the second electronic component and the circuit board or between the second electronic component and the housing.

5. The electronic control device according to claim 4, wherein the first heat dissipation member and the second heat dissipation member each are an adhesive, grease, a sheet-like material containing a highly thermally conductive filler in a thermoplastic resin, or a sheet-like material containing a highly thermally conductive filler in a thermosetting resin.

6. The electronic control device according to claim 1, wherein the circuit board includes wiring that electrically connects the first electronic component and the second electronic component.

7. The electronic control device according to claim 6, wherein the wiring connects a first terminal of the first electronic component and a second terminal of the second electronic component via a shortest path.

8. The electronic control device according to claim 1, wherein the N concave portions are arranged on a thermal interference path between the first electronic component and the second electronic component.

9. The electronic control device according to claim 3, wherein number and arrangement positions of the concave portions are set such that thermal interference at the convex portion between the first electronic component and the second electronic component is cut off, and a heat dissipation path for releasing heat to the base via the convex portion is secured to a maximum extent.

* * * * *